(12) United States Patent
Bai et al.

(10) Patent No.: US 9,739,850 B2
(45) Date of Patent: Aug. 22, 2017

(54) PUSH-PULL FLIPPED-DIE HALF-BRIDGE MAGNETORESISTIVE SWITCH

(71) Applicant: MultiDimension Technology Co., Ltd., Zhangjiagang (CN)

(72) Inventors: Jianmin Bai, Zhangjiagang (CN); Weifeng Shen, Zhangjiagang (CN); Xiaofeng Lei, Zhangjiagang (CN); Xiaojun Zhang, Zhangjiagang (CN); Xiaojun Zhong, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 4 days.

(21) Appl. No.: 14/781,877

(22) PCT Filed: Apr. 1, 2014

(86) PCT No.: PCT/CN2014/074574
§ 371 (c)(1),
(2) Date: Oct. 1, 2015

(87) PCT Pub. No.: WO2014/161482
PCT Pub. Date: Oct. 9, 2014

(65) Prior Publication Data
US 2016/0041238 A1    Feb. 11, 2016

(30) Foreign Application Priority Data
Apr. 1, 2013    (CN) .......................... 2013 1 0111100

(51) Int. Cl.
*H03B 1/00*    (2006.01)
*H03K 3/00*    (2006.01)
(Continued)

(52) U.S. Cl.
CPC .......... *G01R 33/098* (2013.01); *G01R 33/093* (2013.01); *H03K 17/9517* (2013.01); *H03K 17/97* (2013.01)

(58) Field of Classification Search
CPC .. B64G 1/366; G01R 33/0206; G01R 33/028; G01R 33/038; G01R 33/1215; G01D 5/145; G01D 5/147; G01D 5/2013
(Continued)

(56) References Cited

U.S. PATENT DOCUMENTS

| 7,855,556 | B2* | 12/2010 | Sasaki | B82Y 25/00 |
| | | | | 324/252 |
| 2014/0035573 | A1* | 2/2014 | Deak | G01R 33/098 |
| | | | | 324/252 |
| 2014/0203384 | A1* | 7/2014 | Deak | G01R 33/098 |
| | | | | 257/427 |

FOREIGN PATENT DOCUMENTS

| CN | 101369009 | 2/2009 |
| CN | 102073023 | 5/2011 |

(Continued)

OTHER PUBLICATIONS

"International Application No. PCT/CN2014/074574, International Search Report and Written Opinion mailed Jun. 30, 2014", (Jun. 30, 2014), 22 pgs.

*Primary Examiner* — Lincoln Donovan
*Assistant Examiner* — Diana J Cheng
(74) *Attorney, Agent, or Firm* — Schwegman Lundberg & Woessner, P.A.

(57) ABSTRACT

Push-pull half-bridge magnetoresistive switch, comprising two magnetic sensor chips, each magnetic sensor chip having a magnetic induction resistor and a magnetic induction resistor electrical connection pad. The two magnetic sensor chips are electrically interconnected and have opposite and parallel directions of induction, thus forming the push-pull half-bridge circuit. The magnetic induction resistor comprises one or a plurality of magnetoresistive elements connected in series. The magnetic induction resistor pads are located at adjacent edges of the magnetic sensor chips, and each pad may accommodate the welding of at least two bonding wires. The magnetoresistive switch may improve the sensitivity of a sensor, and decrease output voltage deviation and output voltage temperature drift, which is beneficial for decreasing the volume and increasing the performance of the switch sensor.

20 Claims, 13 Drawing Sheets

(51) Int. Cl.
*G01R 33/09* (2006.01)
*H03K 17/97* (2006.01)
*H03K 17/95* (2006.01)

(58) Field of Classification Search
USPC ............ 324/252, 207.21; 338/32 R; 360/313
See application file for complete search history.

(56) References Cited

FOREIGN PATENT DOCUMENTS

| | | |
|---|---|---|
| CN | 102298125 | 12/2011 |
| CN | 102790613 A | 11/2012 |
| CN | 203233390 | 10/2013 |
| JP | 2012185044 | 9/2012 |
| WO | WO-2014/161482 | 10/2014 |

\* cited by examiner

PUSH-PULL FLIPPED-DIE HALF-BRIDGE MAGNETORESISTIVE SWITCH

PRIORITY CLAIM TO RELATED APPLICATIONS

This application is a U.S. national stage application filed under 35 U.S.C. §371 from International Application Serial No. PCT/CN2014/074574, which was filed 1 Apr. 2014, and published as WO2014/161482 on 9 Oct. 2014, and which claims priority to Chinese Application No. 201310111100.7, filed 1 Apr. 2013, which applications and publication are incorporated by reference as if reproduced herein and made a part hereof in their entirety, and the benefit of priority of each of which is claimed herein.

TECHNICAL FIELD

The present invention relates magnetoresistive sensor devices containing multiple chips in a single package. More particularly, the present invention relates to a push-pull flipped-die half-bridge magnetoresistive switch.

BACKGROUND TECHNOLOGY

Magnetic switch sensors are widely used in various applications, including consumer electronics, white goods, three common types of utility meters (electricity, water, gas), automotive, and industrial applications, among others. The current mainstream magnetic switch sensors utilize Hall sensors or anisotropic magnetoresistive (AMR) sensors. For utility meters and in consumer electronics, Hall and AMR switch sensors may consume up to a few microamps, but this is obtained at the expense of reduced operating frequency, the operating frequency of ten hertz. Also, the switching point tens of gauss; in environments that require high operating frequencies, such as automotive, industrial applications, the power consumption of AMR and Hall switch sensors is in the mA level, and the operating frequency is on the order of kilohertz.

Magnetic tunnel junctions (MTJ) have recently been incorporated as sensor elements in many industrial applications. These sensor elements are composed of tunneling magnetoresistive multilayers. The electrical resistance of the magnetic multilayer depends on the magnitude and the orientation of the external magnetic field. In the low-power consumption fields, such as the consumer electronics and three-meters, the MTJ sensors are operating at the frequency of a dozen Hz with the switch point at tens of gauss. In the automobile and other industrial fields under the high frequency condition, the MTJ sensors are consuming only the power of uA at the MHz level.

The power consumption for the existing switch sensors are high in terms of sleep or state power, and low in terms of operating frequency. It requires a switch sensor with a high sensitivity, an excellent response to high frequency and a small volume in hibernation or work status of low power consumption

SUMMARY OF THE INVENTION

Existing switch sensors have a low power sleep state and a high power work state, resulting in low operating frequency. For this purpose, the sensor requires a high-sensitivity in the low-power sleep and working states, low current consumption in both sleep and work states, along with high frequency response, and small size. The present invention provides a push-pull half-bridge magnetoresistive switch, with improved performance over the existing technology.

In order to achieve the above object, the present invention provides a push-pull halfbridge magnetoresistive switch, comprising two magnetic sensor chips, each of the magnetic sensor chips includes a magnetoresistor with electrical bond pads. Two such magnetic sensor chips are electrically interconnected and mechanically arranged such that their sensing axes are anti-parallel, thereby constituting a push-pull half bridge circuit. The magnetoresistors comprise one or a plurality of magnetoresistive elements connected in series, the magnetoresistor are located on dice that have electrical bond pads at the edges, and bond pad is able to accommodate at least two wire bonds.

The present invention proposes a push-pull half-bridge magnetoresistive switch comprising two magnetoresistors, each magnetoresistor is placed on a separate chip, thereby constituting an independent magnetic sensor chip. One of the magnetic sensor chips is rotated in the plane by 180° with respect to the other magnetic sensor chip in order to form of a half-bridge circuit. Other peripheral circuits may be connected to the half-bridge circuit, such as power adjusting circuit, a bias circuit, an amplification circuit, and a digital switch control circuit. The magneto sensor chips have bond pads used for wire bonding the magnetoresistive magnetic sensor chips and the other circuit elements in order to achieve electrical connection.

Additionally, the aforementioned push-pull half-bridge magnetoresistive switch also includes at least one ASIC for converting push-pull half-bridge output into a switching signal.

Further, each of the magnetic sensor chip comprising at least three electrical connections.

Moreover, the aforementioned push-pull half-bridge magnetoresistive switch includes at least one power supply terminal, a ground terminal, and an output terminal, and these are connected via a conductive bond pads to the lead frame, by wirebonding each terminal to the magnetic sensor and ASIC.

Another aspect of the push-pull half-bridge magnetoresistive switch is that it comprises two magnetic sensor chips; each of the magnetic sensor chips comprises a magnetoresistor having bond pads for electrical connections. The two magnetic sensor chips electrically interconnected, and arranged such that their sensing axes are anti-parallel, in order to form a push-pull half-bridge circuit. The magnetoresistors comprise one or more magnetoresistive elements connected in series, the magnetoresistive sensor chip has bond pads at the corner, and they are connected such that pads located across the diagonal are electrically connected to the same side of the magnetoresistor.

Preferably, the above-described push-pull half-bridge magnetoresistive switch, further comprises at least one output signal from the push-pull bridge circuit which is converted to a digital signal by an ASIC.

In one particular embodiment, each of the magnetic sensor chips has at least three electrical connections.

Preferably, the push-pull half-bridge magnetoresistive switch comprises at least three terminals, a power supply terminal, a ground terminal, and an output terminal, and these are created by electrically connecting the lead frame to the magnetic sensor chip and ASIC using wire bonds.

Preferably, the magnetoresistive elements are MTJ elements.

Alternatively, the magnetoresistive elements are GMR elements.

Preferably, the magnetoresistive elements are AMR elements.

Preferably, the magnetoresistive elements utilize on-chip permanent magnets to provide magnetic bias.

Alternatively, the magnetoresistive elements utilize in-stacks magnetic bias.

Alternatively, the magnetoresistive element is magnetically biased by the shape anisotropy.

Preferably, the two magnetic sensor chips are arranged such that their sensing axes are along the same axis, and this direction is parallel or perpendicular to the line that passes through the center of both sensor chips.

According to the preferred implementation of the present invention the beneficial effects are: the half-bridge push-pull structure can improve the sensitivity of the sensor; two sensor chips can be well-matched, to reduce the variation in output voltage and also to reducing the voltage drift with temperature; innovative packaging and wire bonding of the sensor chips reduces the size and improves the performance of the switch sensor.

The above description is only an overview of technical solutions of the present invention. In order to more clearly illustrate the technical details of the implementation of the present invention in accordance with the contents of the specification, the following a preferred embodiment of the present invention accompanying drawings are provided. Specific embodiments of the present invention are given in detail in the examples that follow.

BRIEF DESCRIPTION OF THE DRAWINGS

The drawings described herein are used to provide a further understanding of the present invention. They constitute a part of this application in order to illustrate an exemplary embodiment of the present invention. They should not however be construed to limit the present invention. The drawings are as follows.

DETAILED DESCRIPTION

Figure 1:
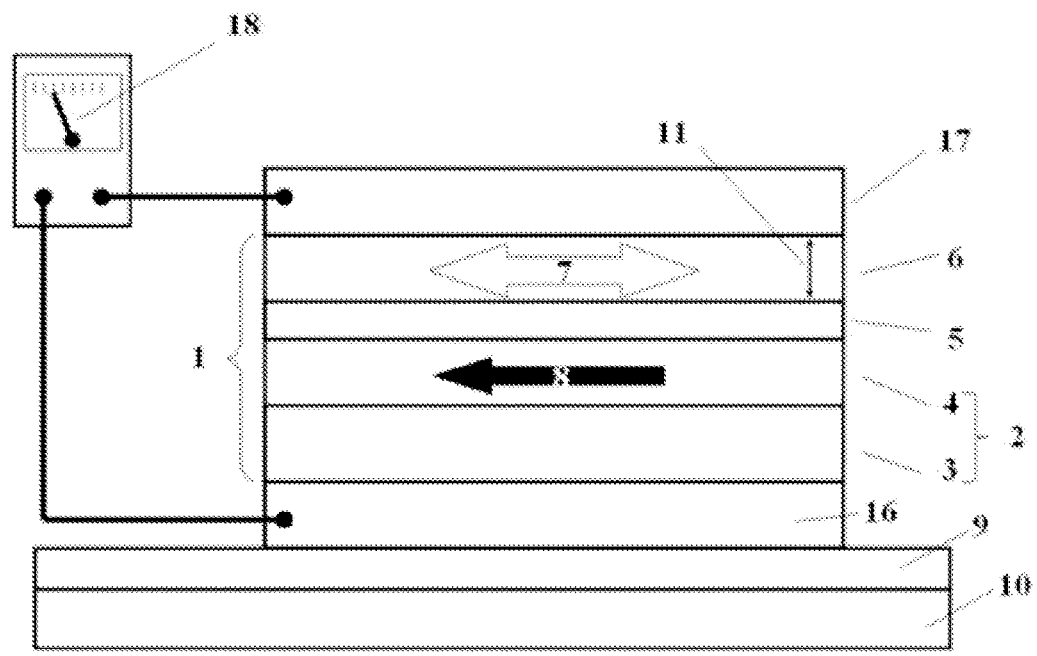
FIG. 1 is a cross-sectional diagram of the type of MTJ element used in a water meter, connected to an ohmmeter.

The present invention will described referring to the drawings of the preferred embodiments shown below.

FIG. 1 is a schematic cross section of MTJ elements connected to the meter, which shows the structure and electronic measurement principle MTJ element. MTJ 1 comprises a pinning layer 2, a tunnel barrier layer 5, and the ferromagnetic layer 6, also called sense layer 6. Pinned layer 2 comprises a ferromagnetic layer 4, also known as the pinned layer 4 and an antiferromagnetic layer 3, ferromagnetic exchange coupling pinned layer 4 and antiferromagnetic layer 3 determines the direction of magnetization of the ferromagnetic layer 4. The tunnel barrier layer 5 is typically made of MgO or $Al_2O_3$ deposited on top of ferromagnetic layer 4. Ferromagnetic layer 6 is located on top of tunnel barrier 5. Arrows 8 and 7, respectively, represent the magnetization directions of the pinned layer 4 and the sense layer magnetization vectors. Pinned layer 4 magnetization vector 8 is fixed in place and does not respond to moderate magnetic fields, whereas the sense layer 6 magnetization vector 7 is free to rotate with respect to the pinned layer 4 magnetization vector 8. In order to reduce the hysteresis effect, you can add a cross bias field $H_{bias}$ in the direction perpendicular to the sense direction. For reducing hysteresis effect, the magnetization vector 7 of the sense layer needs to coherently rotate. A typical thickness of the antiferromagnetic layer 3, the ferromagnetic layer 4, the tunnel barrier layer 5, and ferromagnetic layer 6 ranges from 0.1 nm to 100 nm.

Bottom and top electrodes, 16 and 17, are in direct electrical contact with their respective layers 3 and 6. The electrodes 16, 17 are usually a non magnetic conductive metal, and must be suitable for carrying electrical current to the inputs to Ohmmeter 18. The ohmmeter 18 applies a known electric potential (or current) across the entire stack, and measures the resulting electrical current (or voltage) that results to calculate the resistance. Ordinarily, the tunnel barrier 5 is the majority of the resistance in such a device, say 1000 ohms and all of the rest of the lead resistance is 10 ohms. Bottom conducting layer, 16, is supported by an insulating substrate material, 9, whose edges extend beyond those of layer 16. Insulating substrate material 9 may, in turn, be supported by other body substrate materials, 10. The body substrate materials are most commonly silicon, but can be glass, pyrex, GaAs, AlTiC, or any other material that provides adequate wafer integrity. Silicon is prized for its ease of processing into circuits, though such circuits are not always needed for magnetic sensors.

Figure 2:
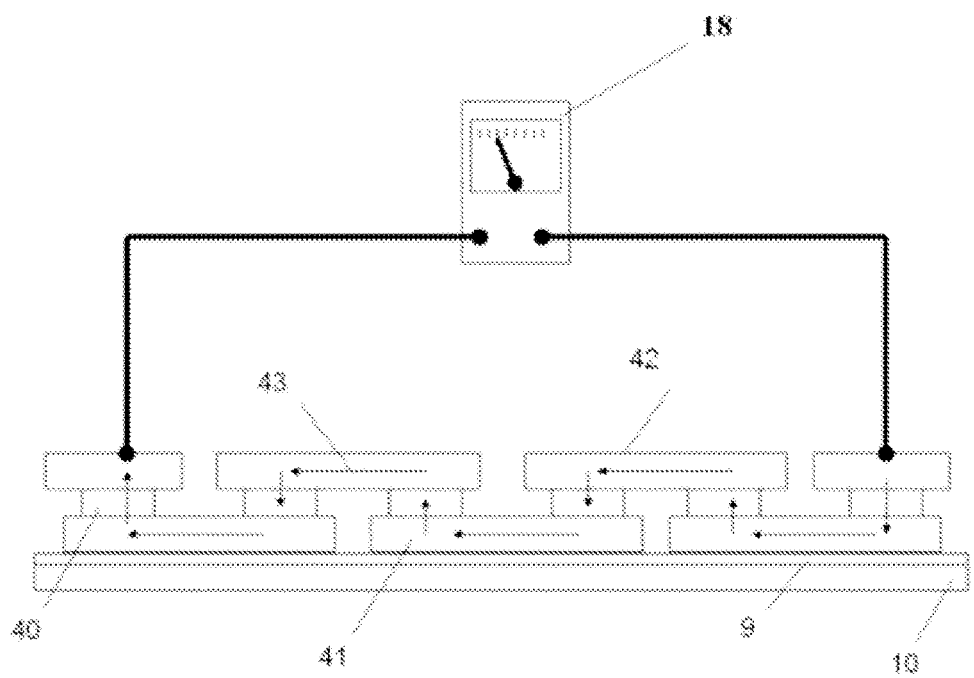
FIG. 2 is a cross-sectional schematic view of MTJ elements connected in a series string to form a magnetoresistive element.

FIG. 2 shows a cross section of MTJ elements connected in series to form a magnetoresistor.

Because of their small size, MTJ elements can be connected together in a string in order to increase sensitivity, reduce 1/F noise, and improve resistance to electrostatic discharge as shown in FIG. 2. The MTJ elements 40 are sandwiched between bottom 41 and top 42 electrodes, and interconnected such that the current 43 flows vertically through the MTJ 40 and horizontally through alternating conductors patterned from the top and bottom conducting layers. Bottom electrode 41 is supported on insulating layer 9 and possibly additional substrate body 10. In the bridge circuit of the sensor, there is a reference arm and the sensor arm, the resistance value of the reference arm does not change with the applied magnetic field changes, and the resistance value of the induction arm varies with changes in the external magnetic field. It is advantageous to keep the same size MTJ junctions in the reference and sensor arms of the bridge, because it makes the device less sensitive to etch bias during fabrication, so a further advantage of these strings of MTJ elements is the number of elements in each string can be varied in order to set the optimal resistance ratio between the reference and sensor arms of the bridge.

On-Chip Permanent Magnet Design

Figure 3:
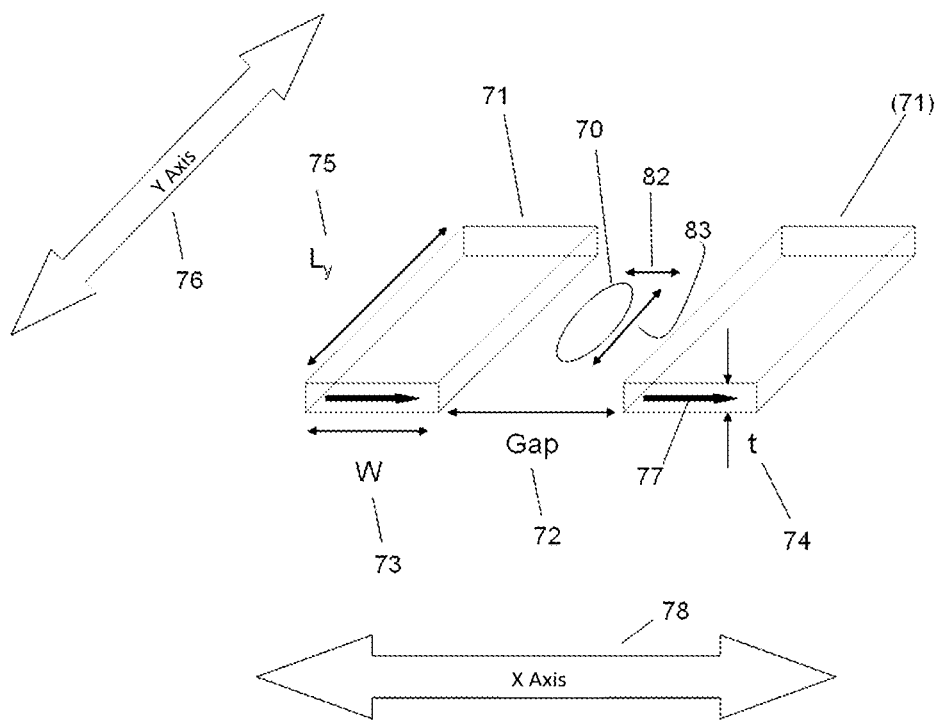
FIG. 3 is a perspective view of the MTJ element is located between two permanent magnets.

Here is described a preferred method for providing $H_{Bias}$ mentioned above. This method is illustrated in FIG. 3. Here, a magnetoresistive sensor 70 is situated between two on-chip magnets 71. The top surface of the underlying semiconductor substrate on which they are formed is not shown for clarity. The magnets are separated by a "gap" 72; have width "W" 73, thickness "t" 74, and length "Ly" 75. The magnets are designed to provide a cross-bias field in the direction perpendicular to the sensitive axis, or Y axis 76 of the bridge sensor, but largely in the plane of the substrate. This axis will be called the Cross Axis or X Axis, 78. Magnetoresistive element, 70, has an elliptical shape having width $W_{MR}$, 82, and length $L_{MR}$, 83. The cross section of MR element 70 is shown in FIG. 3. The permanent magnets are initialized using a large magnetic field, such that their remnant magnetization $M_{PM}$, 77 is largely perpendicular to the Sense Axis or Y Axis, 76 of the bridge sensor, and largely parallel to the Cross Axis or X axis, 78, and within the X-Y plane. Here the X and Y axes are the standard orthogonal Cartesian coordinate axes, the Z axis is normal to the substrate surface. The X-Y plane is also called the "sensing plane."

Figure 4:
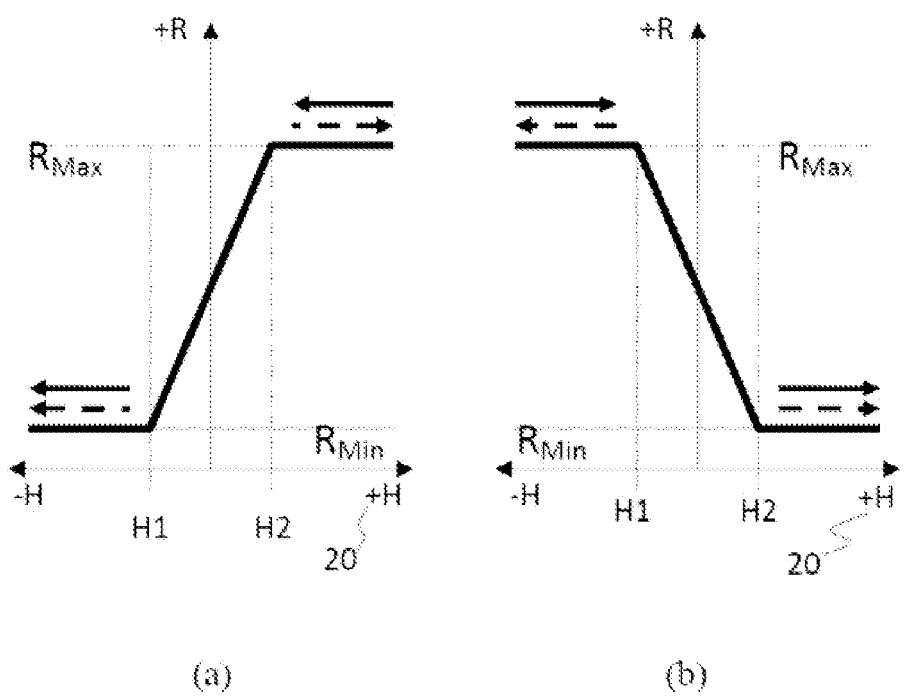
FIG. 4 is a plot showing the response of a magnetoresistive sensor element to an applied magnetic field.

Shown in FIG. 4, when the external magnetic field 20 is parallel with the magnetic pinned layer 2 and the applied magnetic field strength is greater than H1, the orientation of the magnetic free layer 4 shown as dashed lines is also parallel with the external magnetic field 20. Therefore, it is parallel with the magnetic pinning layer 2. Under this circumstance, the MTJ structure demonstrates the minimum resistance. When the external magnetic field 20 is anti-parallel with the magnetic pinned layer 2 and the applied magnetic field strength is greater than H2, the orientation of the magnetic free layer 4 is also anti-parallel with the external magnetic field 20. Therefore, it is anti-parallel with the magnetic pinning layer 2. Under this circumstance, the MTJ structure demonstrates the maximum resistance. The magnetic field range between H1 and H2 is the measuring range of the MTJ. When as shown in FIG. 4 (*a*) the pinned layer magnetization is rotated by 180° the magneto resistance response to the same magnetic field is as shown in 4 (*b*).

Figure 5:
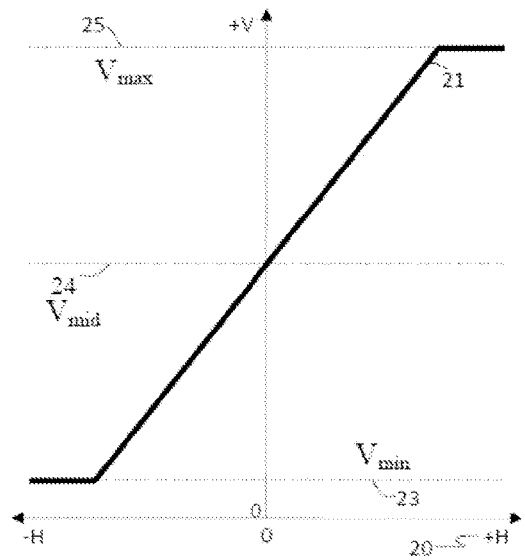
FIG. 5 is a graph of the voltage output of a half bridge TMR sensor as a function of applied magnetic field.
Figure 6:
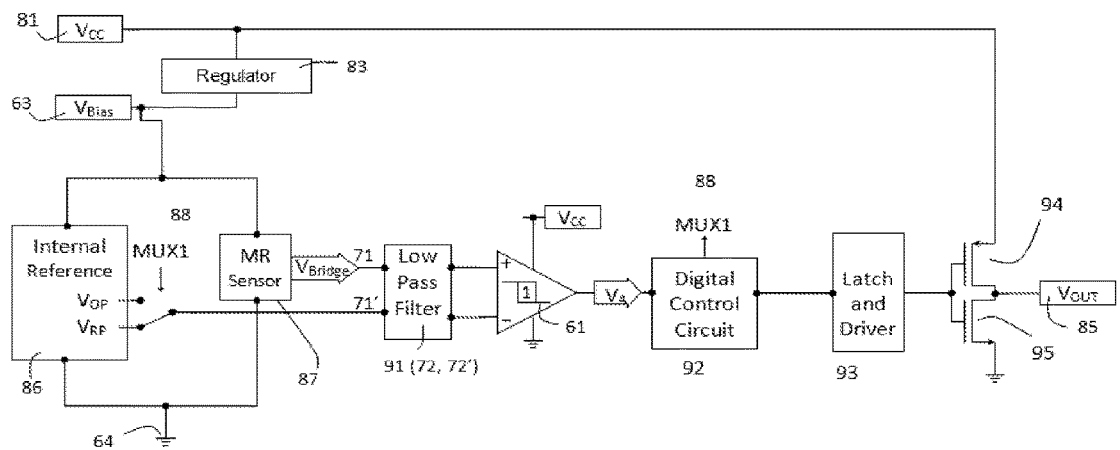
FIG. 6 is a circuit diagram according to the present invention, which comprises a push-pull half-bridge magnetoresistive magnetic sensor chip and ASIC.
Figure 14:
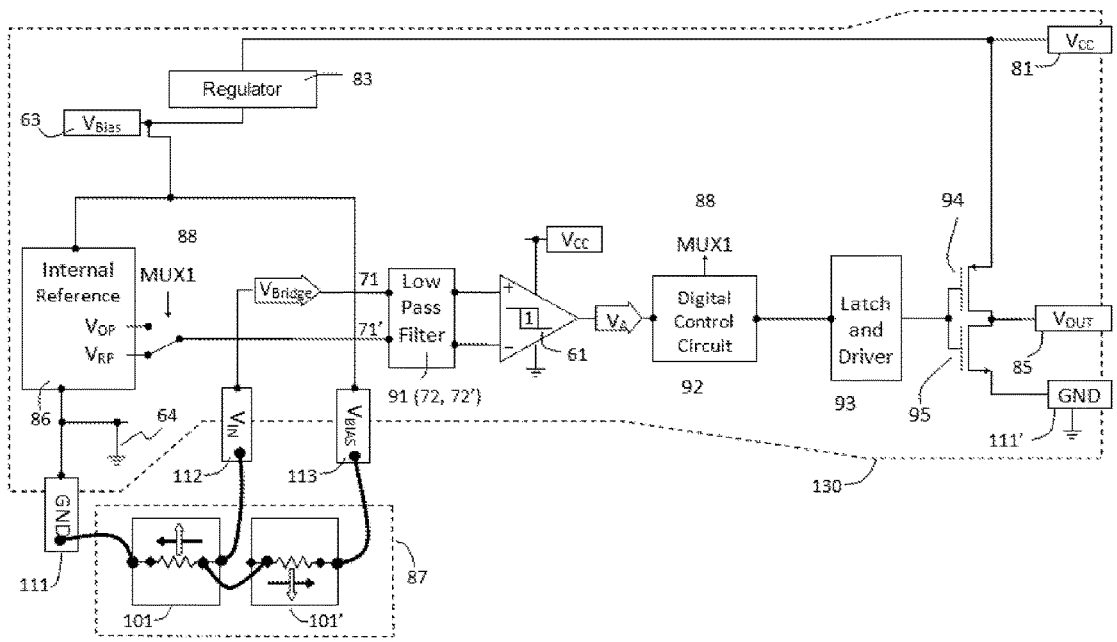
FIG. 14 a circuit block diagram according to another implementation of the magnetoresistive switching circuit of the present invention.

If two such resistors are combined in series to form a half-bridge circuit, wherein one of the resistors is rotated 180° degrees about the axis normal to the sensing plane, its resistance curve will have the opposite polarity, as shown in FIGS. 4 (*a*) and 4 (*b*). When two resistance legs of a half-bridge have opposite polarity response to an applied field, they are called a "push-pull" half-bridge because when the value of one resistor increases, the value of the other resistor decreases. The output of this magnetoresistive push-pull flip die half-bridge is shown as curve 21 in FIG. 5. This is a plot of Bridge Voltage Output (V) vs. Applied Magnetic Field H curve 20. For large positive values of H (+H) the bridge output voltage is at a maximum value 25, $V_{Max}$. For large negative values of H (−H) the output voltage is at minimum value 23, $V_{Min}$. In zero applied field, the bridge output voltage is at a middle value 24, $V_{Mid}$, approximately half-way between $V_{Max}$ and $V_{Min}$. The bridge output can be measured by a voltmeter, or it can be used as the input to higher level electrical circuitry such as a magnetoresistive switch product FIG. 6 shows a circuit block diagram of the magnetoresistive switch of the present invention composed of a push-pull half-bridge sensor chip and ASIC. The push-pull half-bridge, the output of which is shown in FIG. 5, can be used as 87, (MR Sensor). It has three electrical interconnections, the power supply $V_{Bias}$, the ground GND, and the half-bridge output voltage $V_{Bridge}$. $V_{Bridge}$ is the same signal as curve 21 in FIG. 5. FIG. 6 shows a push-pull half-bridge switches includes in addition to the MR Sensor part of the circuit an ASIC is used for converting the output signal of a push-pull half-bridge to a switching signal. The ASIC includes a voltage regulator circuit 83, an internal reference circuit 86, a multiplexer 88, a low pass filter 91, and a comparator circuit 61 followed by the connection, the digital control circuit 92 and a latch driving circuit 93 and the like. The MR Sensor structure will be described later; FIG. 14 shows the connection in this switching circuit chip and chip. The following will first describe the physical layout of the magnetic sensor chip of the present invention.

Each magnetic magnetoresistor is comprised of a large number of MTJ elements. The magnetoresistors are located on a substrate 10, the substrate material is typically silicon, but it may also be glass, printed circuit boards, alumina, ceramics and other materials. Many identical magnetoresistors may be fabricated using lithographic methods and other manufacturing process, in a rectangular area on a silicon wafer, these chips may then be singulated by wafer sawing, laser cutting, or other methods which do not damage the chip. From the same wafer a large number of devices may be fabricated, each device after the separation is called a magnetic sensor chip. The cutting process determines the shape of the magnetic sensor chip, normally, the chip shape is rectangular. If the design has different types of sensors chips on the wafer, it will increase the difficulty of production, testing and packaging of chips. Therefore, in order to achieve better economic efficiency, a single design should be built on a wafer. The present invention is a push-pull half-bridge circuit using two magnetic sensor chips preferably using the same design, thereby simplifying the manufacturing steps and improving economic efficiency. However, in the application, there is a need to address the following two difficulties: how to match the example shown in FIG. 6 switches other circuits, such as a linear amplifier, A/D conversion circuit, a power supply circuit, a control circuit, so as to constitute a working switch; and how to mechanically arrange two identical magnetic sensor chips into a MR Sensors that each has the opposite polarity response.

Figure 7:
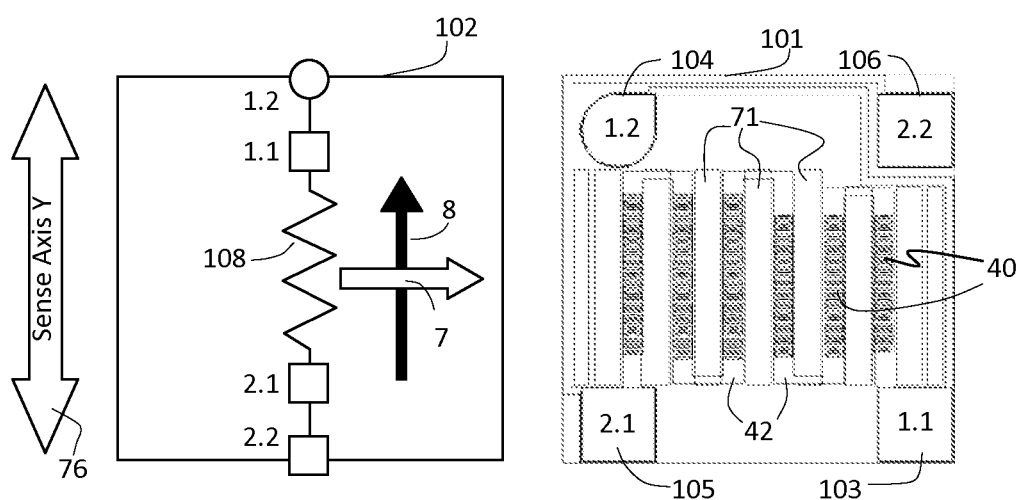
FIGS. 7 (a) and (b) provide a schematic and physical representation of a magnetic sensor chip.

According to the present invention, one of the two magnetic sensor chips will be rotated and connected in series to form a push-pull half-bridge circuit. FIGS. 7 (*a*) and (*b*)

show the MTJ magnetoresistive elements connected in series to form a magnetoresistor on the magnetic sensor chip, and a circuit diagram of a top view of a representative magnetoresistor electrically interconnected in series. A block diagram of a circuit schematic of magnetic and magnetic sensor chip 102 is shown, it contains a magnetoresistor 108 that has two terminals, and depending on the orientation of the device, the pinned layer magnetization vector 8 may point to the terminals named 'top' 1.1; the terminal at the other end is named 'bottom' 2.1. Each side has two electrically interconnected terminals connected to the electrical terminals top 1.1 1.2, the bottom of the electrical terminals 2.2 and 2.1 are connected at each end and electrically interconnected terminals is represented by a square or a circle, in which round terminal is associated with the top, and corresponds to the circular pad 104, the pad with the circle is used to identify the polarity of the magnetoresistor. The direction of black arrow 8 represents the magnetization vector of the pinned layer; the direction of arrow 7 is a magnetic field that aligns the sense layer magnetization vector, the sensing axis 76 and the pinned layer magnetization vector 8 are parallel.

In FIG. 7 (b) the rectangular chip 101 is a magnetic sensor chip, and the physical layout of FIG. 7 (b) is a preferred embodiment of the present invention. The chip has four pads 103-106, corresponding to the terminals in FIG. 7 (a) numbered 1.1, 1.2, 2.1, 2.2. The pad 104 is circular, while the other three pads are square. This arrangement provides a means for determining the sensing polarity of the chip. Permanent magnet 71 provides cross-axis bias field $H_{bias}$. A magnetoresistor 108 comprises a plurality of MTJ elements 40 connected in series. The top electrode 42 is used for wirebonding and electrically connecting magnetoresistors, that is, interconnecting magnetoresistor strings.

Figure 8:
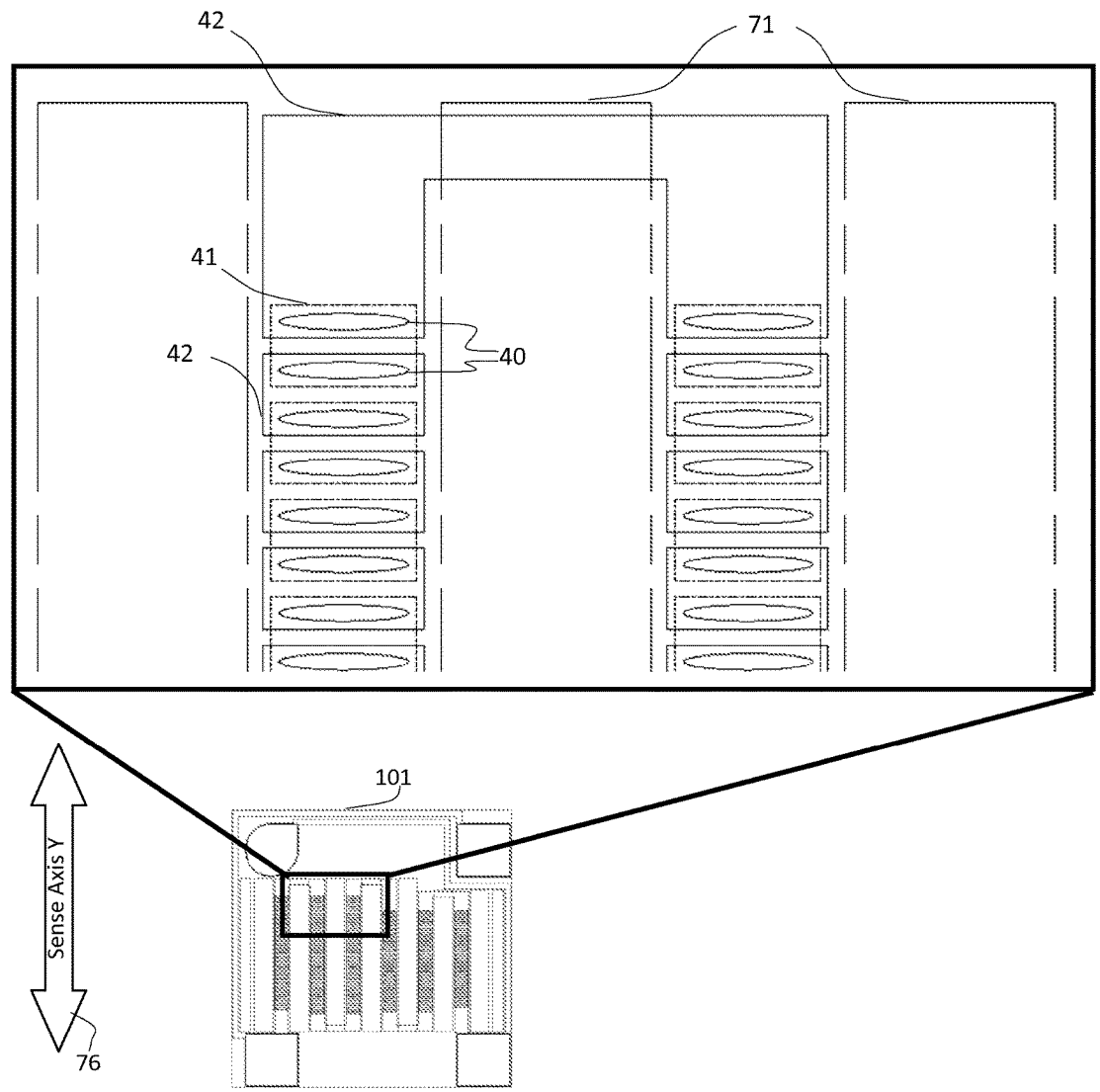
FIG. 8 shows a close up of the magnetic sensor chip shown in partial detail in FIG. 7 (b).

FIG. 8 shows an enlarged schematic view of FIG. 7 (b). The solid-line ovals 40 are MTJ elements, rectangle 41 is a bottom electrode, and rectangular shape 42 is the top electrode. FIGS. 7 and 8 together constitute a top view of one embodiment of the invention the magnetic sensor chip. The following embodiments utilize these features, and the description will not be repeated. FIGS. 9-12 show a 2 cases of the implementation and 5 example arrangements, in which the number of magnetoresistive elements string may be different, MTJ element size can be different, the size and location of the pads may be different.

Figure 9:
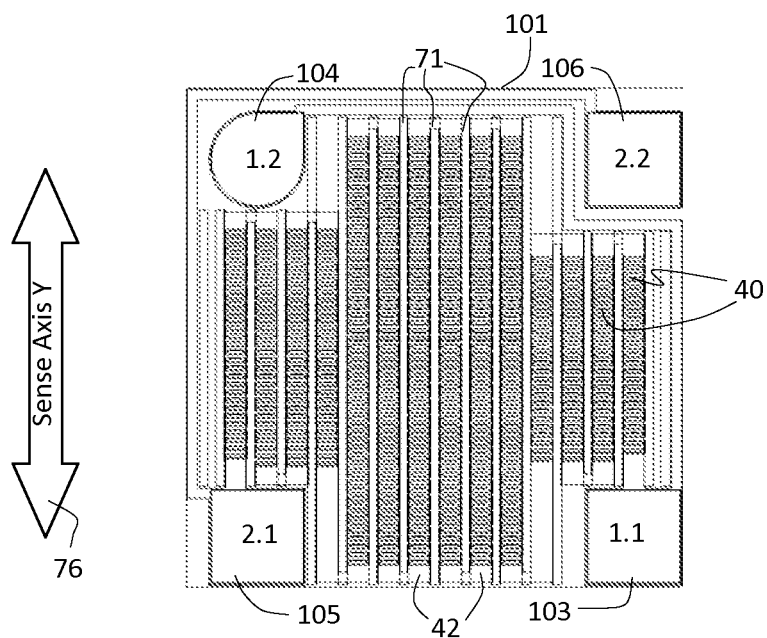
FIG. 9 is a top view of a second embodiment of a magnetic sensor chip of the present invention.

FIG. 9 is a rectangular chip magnetic sensor chip 101, having the physical layout of embodiment 2 according to the present invention. The chip has four pads 103-106, for providing electrical connections according to the implementation. For example, the pad 104, the corresponding terminal 1.2, has a circular shape, while the other three pads are square. Permanent magnet 71 provides cross-axis bias field $H_{bias}$. The magnetoresistor 108 comprises serially connected MTJ elements 40. The top electrode 42 is used to achieve electrical connection between the pad and the magnetoresistive element string, between the individual magnetoresistive elements, and between the magnetoresistor strings.

Figure 10:
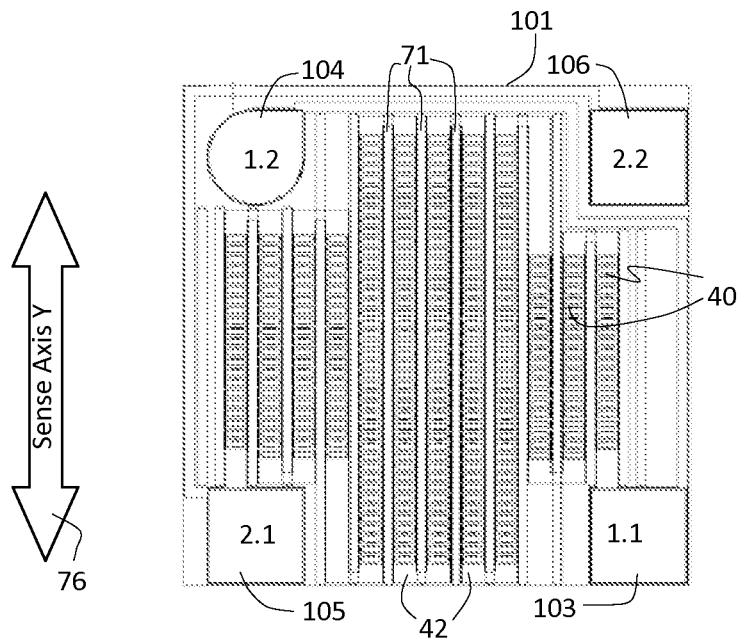
FIG. 10 is a top view of the third embodiment of a magnetic sensor chip of the present invention.

FIG. 10 is a rectangular chip magnetic sensor chip 101, having the physical layout of the embodiment 3 according to the present invention. The chip has four pads 103-106, electrical connections according to the present implementation. For example, the pad 104, the corresponding terminal 1.2, a circular shape, while the other three pads are square. Permanent magnet 71 provides cross-axis bias field $H_{bias}$. The magnetoresistor 108 comprises a number of serially connected MTJ elements 40. The top electrode 42 is used to achieve electrical connection between the pad and the magnetoresistive element string, between the individual magnetoresistive elements, and between the magnetoresistor strings.

Figure 11:
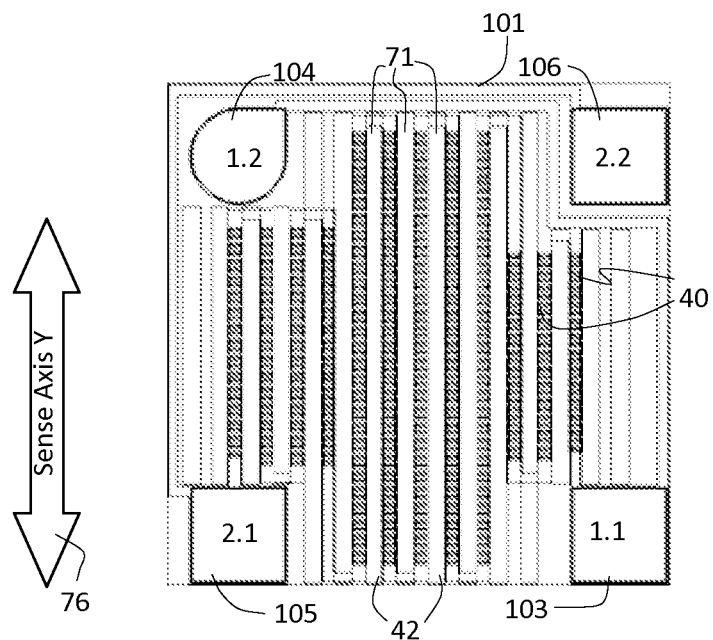
FIG. 11 is a top view of a fourth embodiment of a magnetic sensor chip of the present invention.

FIG. 11 is a rectangular chip magnetic sensor chip 101, having the physical layout of the embodiment 4 according to the present invention. The chip has four pads 103-106, electrical connections according to the present implementation. For example, the pad 104, the corresponding terminal 1.2, a circular shape, while the other three pads are square. Permanent magnet 71 provides cross-axis bias field $H_{bias}$. The magnetoresistor 108 comprises a number of serially connected MTJ elements 40. The top electrode 42 is used to achieve electrical connection between the pad and the magnetoresistive element string, between the individual magnetoresistive elements, and between the magnetoresistor strings.

Figure 12:
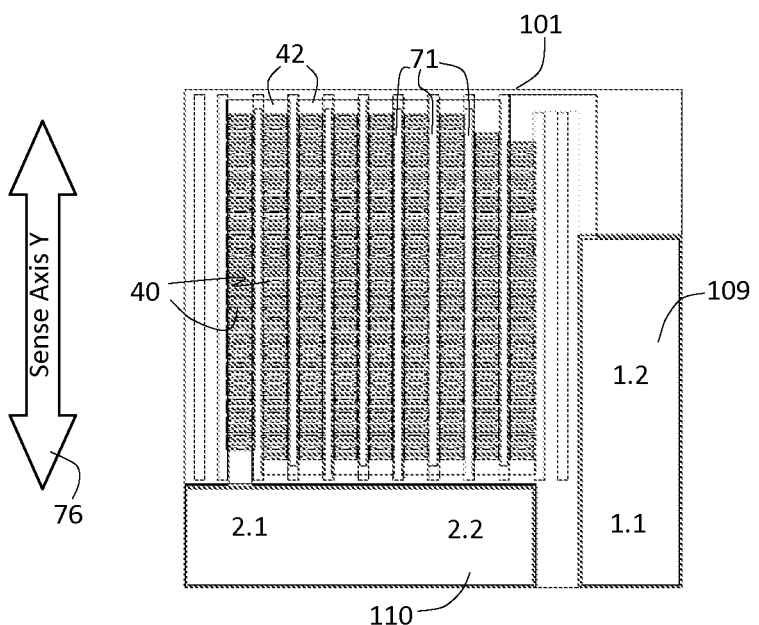
FIG. 12 is a top view of a fifth embodiment of a magnetic sensor chip of the present invention.

FIG. 12 is a rectangular chip magnetic sensor chip 101, having the physical layout of the embodiment 5 according to the present invention. The chip 101 has two pads, with respect to each of the above embodiments, each of the chip pads in Example 5 in this embodiment is elongated to accommodate two electrical connection points. For example, the pad 109 comprising terminals 1.1 and 1.2 corresponding welding point, the pad 110 includes terminals 2.1 and 2.2 corresponding welding point. Permanent magnet 71 provides cross-axis bias field $H_{bias}$. The magnetoresistor 108 comprises a number of serially connected MTJ elements 40. The top electrode 42 is used to achieve electrical connection between the pad and the magnetoresistive element string, between the individual magnetoresistive elements, and between the magnetoresistor strings.

Figure 13:
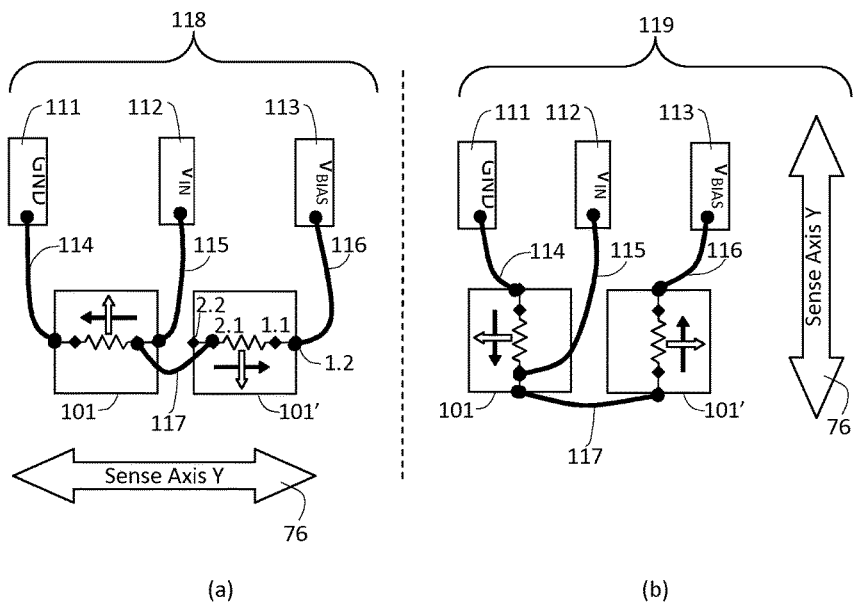
FIGS. 13 (a) and (b) is a schematic diagram of the circuit used for the first type and the second type of half-bridge circuit of the present invention.

FIGS. 13 (a) and 13 (b) are 'half-bridge flipped die' circuits formed according to the present invention. The first type and the second type of circuit diagram, shows two magnetic sensor chips 101 and 101' in which the magnetization is rotated 180 degrees within the plane, and two methods of placing the chips. Both configurations of the relationship between the chip center axis vector direction and sense to describe. In configuration 118, the connection of two magnetic sensor chips is such that the sensing axis is parallel to the line running through the center of both chips. In configuration 119, the sensing axis is perpendicular to the line running through the center of both chips. Like the above, the sensing axis 76 is parallel to the black arrows on each of the magnetic sensor chip.

Configurations 118 and 119, respectively, are configured with three electrical terminals: GND 111, V+ 112, and $V_{bias}$ 113. In addition, some electrical lines 114-117, these lines may also be referred to as wire bonds, can be used to connect the pads of the devices within the chip. By connecting line 117, the two chips 101 and 101' constitute a series arrangement, located in the lower end of the half-bridge circuit of the magnetic sensor chip is connected to the GND via the connection line 114. Located half-bridge circuit high magnetic sensor chip is connected to the power supply through a cable 116 $V_{bias}$, the output of the half-bridge circuit is connected to the output terminal $V_{bridge}$ via a connection 115.

FIG. 14 is a circuit block diagram of the concept in FIG. 6 for an improved half-bridge push-pull magnetic switch sensor, which adds the flip-chip half-bridge circuit shown in FIG. 13. In FIG. 14 boundary 87 represents the flip-chip half-bridge sensor in the circuit diagram; boundary 130 is the ASIC circuit diagram shown in FIG. 6. The ASIC circuit diagram has GND connection point 111, $V_{Bridge}$ 112 and $V_{bias}$ 113, respectively the corresponding half-bridge circuit connected to the terminal, permitting the interconnection of the bridge circuit and the ASIC circuit. The ASIC external terminals are: $V_{CC}$ 81, $V_{out}$ 85 and the GND 111' located on the right side of FIG. 14. GND 111 and GND 111' can be connected on chip through a long bond wire, or the two grounds GND 111 and GND 111' may be connected to a large pad.

Figure 15:
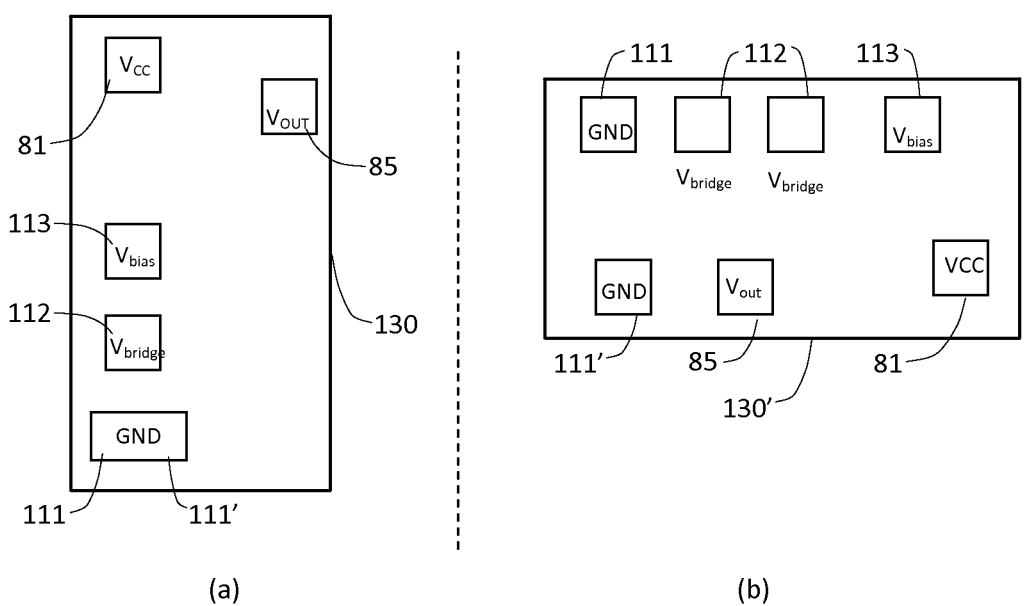
FIGS. 15 (a) and (b) shows two ways to arrange the ASIC wire bond pads.

FIG. 15 is a top view schematic of two methods for distributing the pads in FIG. 14. FIG. 15 (*a*) is formed ASIC 130 first way, it has the following pads: $V_{CC}$ 81, $V_{out}$ 85, GND 111, GND 111', $V_{Bridge}$ 112, and $V_{bias}$ 113. FIG. 15 (*b*) is formed in the second way, denoted ASIC 130'. It has the following pads: $V_{CC}$ 81, $V_{out}$ 85, GND 111, GND 111' (two separate pads), $V_{Bridge}$ (two) 112, and $V_{bias}$ 113. Both chips have similar functions, but each version supports different interconnection schemes.

To form a complete magnetic switch the package needs to include an integrated circuit such as an ASIC and two magnetoresistive sensors into a single three-terminal package. Some possible encapsulation methods to achieve this goal will be described in FIGS. 16-19 below.

Figure 16:
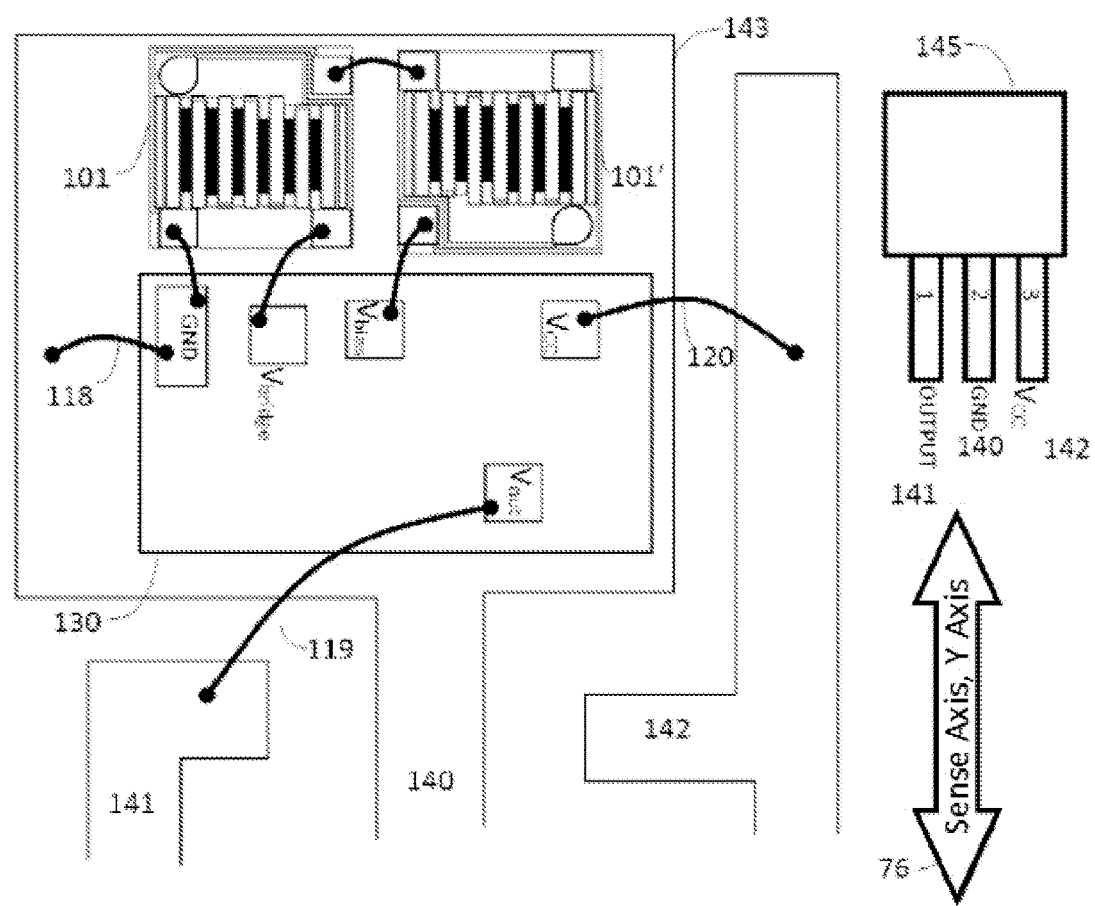
FIG. 16 shows a first magnetoresistive sensor magnetic sensor chip package of the present invention.

Shown in the left side of FIG. 16 is a lead frame chip and wire bond diagram. Rectangle 143 is a leadframe-based chip paddle, made from copper or other conductive material, and paddle 143 is connected to ground terminal 140. The magnetic sensor chips 101 and 101' in the upper part of paddle 143, ASIC 130 is located in the lower part of paddle 143, the chip can be bonded to the paddle using adhesive such as epoxy. Magnetoresistive sensor chips 101 and 101' are arranged such that the external magnetic field has in the same direction produces polarity response, e.g., the pinned layer magnetization vector is rotated by 180 degrees relative to each other, and so placed as shown in the figure. The sensing axis of the device 76 is shown at the bottom. In addition to connecting magnetic chips 101 and 101' with the ASIC 130 using wire bonds 114-117, there is another three interconnections: Interconnection line 118 connected to the ASIC GND 111' to the base of paddle 143 GND terminal 140, formed GND terminal; Interconnect 119 is connected ASIC $V_{out}$ into the pin 141, to form the output terminal OUTPUT. Interconnect 120 is connected $V_{CC}$ to pin 142, to form $V_{cc}$ terminal. When the wire bonding is completed, the paddle and terminals are enclosed in a plastic case 145, and the external pins extend outside the plastic case. The outline of the plastic case 145 for a magnetic switch product is shown on the right side.

Figure 17:
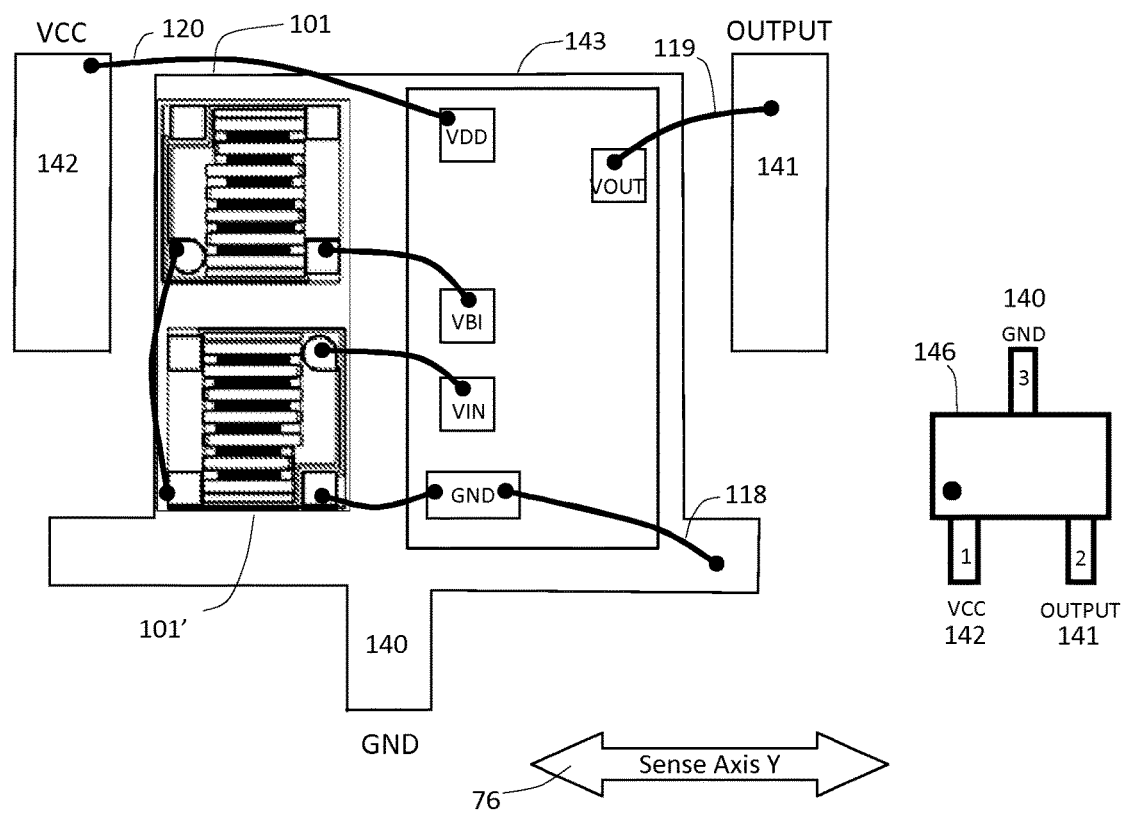
FIG. 17 shows a second magnetoresistive sensor magnetic sensor chip package.

Shown in the left side of FIG. 17 is a lead frame chip and wire bond diagram. Rectangle 143 is a leadframe-based chip paddle, made from copper or other conductive material, and paddle 143 is connected to ground terminal 140. The magnetic sensor chips 101 and 101' in the left-side part of paddle 143, ASIC 130 is located in the right-side part of paddle 143, the chip can be bonded to the paddle using adhesive such as epoxy. Magnetoresistive sensor chips 101 and 101' are arranged such that the external magnetic field has in the same direction produces polarity response, e.g., the pinned layer magnetization vector is rotated by 180 degrees relative to each other, and so placed as shown in the figure. The sensing axis of the device 76 is shown at the bottom. In addition to connecting magnetic chips 101 and 101' with the ASIC 130 using wire bonds 114-117, there is another three interconnections: Interconnection line 118 connected to the ASIC GND 111' to the base of paddle 143 GND terminal 140, formed GND terminal; Interconnect 119 is connected ASIC $V_{out}$ into the pin 141, to form the output terminal OUTPUT. Interconnect 120 is connected $V_{CC}$ to pin 142, to form $V_{cc}$ terminal. When the wire bonding is completed, the paddle and terminals are enclosed in a plastic case, and the external pins extend outside the plastic case. The outline of the plastic case 146 for a magnetic switch product is shown on the right side.

Figure 18:
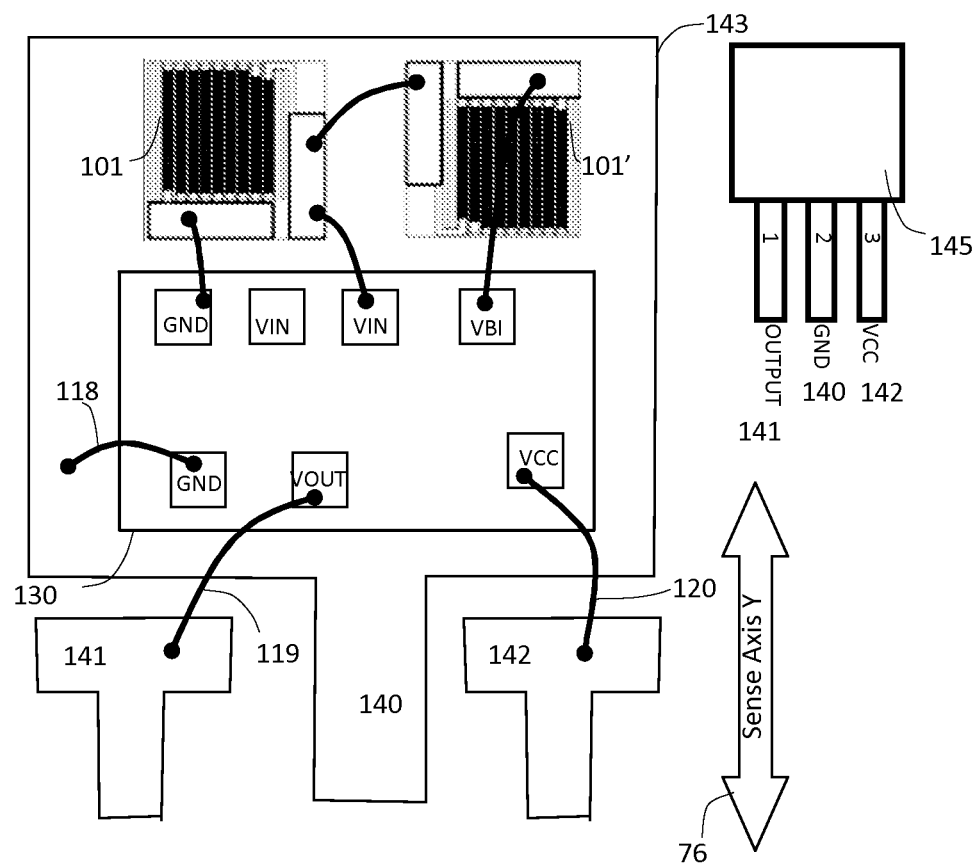
FIG. 18 shows a third magnetoresistive sensor magnetic sensor chip package

Shown in the left side of FIG. 18 is a lead frame chip and wire bond diagram. Rectangle 143 is a leadframe-based chip paddle, made from copper or other conductive material, and paddle 143 is connected to ground terminal 140. The magnetic sensor chips 101 and 101' in the upper part of paddle 143, ASIC 130 is located in the lower part of paddle 143, the chip can be bonded to the paddle using adhesive such as epoxy. Magnetoresistive sensor chips 101 and 101' are arranged such that the external magnetic field has in the same direction produces polarity response, e.g., the pinned layer magnetization vector is rotated by 180 degrees relative to each other, and so placed as shown in the figure. The sensing axis of the device 76 is shown at the bottom. In addition to connecting magnetic chips 101 and 101' with the ASIC 130 using wire bonds 114-117, there is another three interconnections: Interconnection line 118 connected to the ASIC GND 111' to the base of paddle 143 GND terminal 140, formed GND terminal; Interconnect 119 is connected ASIC $V_{out}$ into the pin 141, to form the output terminal OUTPUT. Interconnect 120 is connected $V_{CC}$ to pin 142, to form $V_{cc}$ terminal. When the wire bonding is completed, the paddle and terminals are enclosed in a plastic case, and the external pins extend outside the plastic case. The outline of the plastic case 146 for a magnetic switch product is shown on the right side.

Figure 19:
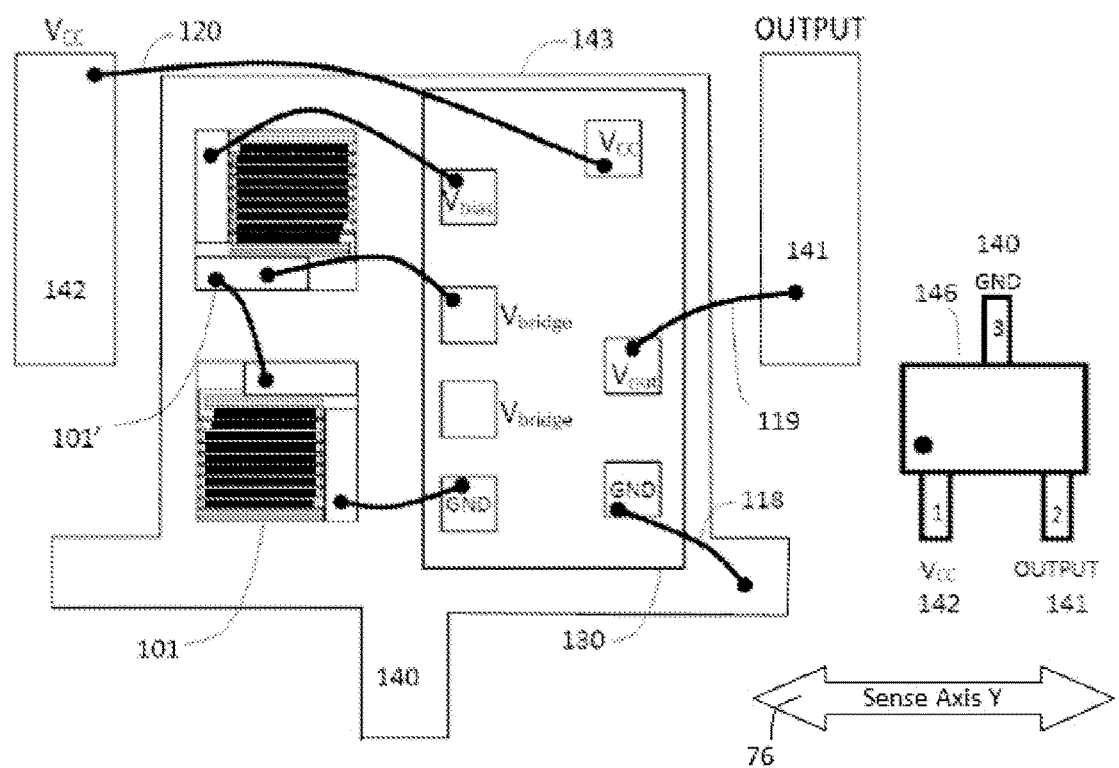
FIG. 19 shows a fourth magnetoresistive sensor magnetic sensor chip package

Shown in the left side of FIG. 19 is a lead frame chip and wire bond diagram. Rectangle 143 is a leadframe-based chip paddle, made from copper or other conductive material, and paddle 143 is connected to ground terminal 140. The magnetic sensor chips 101 and 101' in the left-side part of paddle 143, ASIC 130 is located in the right-side part of paddle 143, the chip can be bonded to the paddle using adhesive such as epoxy. Magnetoresistive sensor chips 101 and 101' are arranged such that the external magnetic field has in the same direction produces polarity response, e.g., the pinned layer magnetization vector is rotated by 180 degrees relative to each other, and so placed as shown in the figure. The sensing axis of the device 76 is shown at the bottom. In addition to connecting magnetic chips 101 and 101' with the ASIC 130 using wire bonds 114-117, there is another three interconnections: Interconnection line 118 connected to the ASIC GND 111' to the base of paddle 143 GND terminal 140, formed GND terminal; Interconnect 119 is connected ASIC $V_{out}$ into the pin 141, to form the output terminal OUTPUT. Interconnect 120 is connected $V_{CC}$ to pin 142, to form $V_{cc}$ terminal. When the wire bonding is completed, the paddle and terminals are enclosed in a plastic case, and the external pins extend outside the plastic case. The outline of the plastic case 146 for a magnetic switch product is shown on the right side.

The preferred embodiments of the present invention have been described in detail, but the present invention is not limited thereto. Those skilled in the art may make various modifications according to the principles of the present invention. Therefore, any modifications that do not deviate from the principles described herein are to be understood to fall within the scope of the present invention.

The invention claimed is:

1. A push-pull half-bridge magnetoresistive switch sensor, comprising:
   a case;
   a leadframe-based chip paddle with a protrusion to form a ground terminal extending from inside to outside of the case, a first pin to form a VCC terminal extending from inside to outside of the case, and a second pin to form an output terminal extending from inside to outside of the case;

two magnetic sensor chips within the case, including a first magnetoresistive sensor chip with at least one magnetoresistive element and a first pinned layer magnetization vector and a second magnetoresistive sensor chip with at least one magnetoresistive element and a second pinned layer magnetization vector, the first and second magnetoresistive sensor chips being attached to the chip paddle and arranged for the first and second pinned layer magnetization vectors to be at a 180 degree rotational angle relative to each other, wherein each of the magnetic sensor chips has bond pads adjacent to magnetic sensor chip edges for electrical connection, and each of the bond pads can accommodate at least two wire bonds, and the two magnetic sensor chips are electrically interconnected via wire bonds to provide series-connected magnetoresistive elements to form a push-pull half-bridge circuit, the push-pull half-bridge circuitry including a half-bridge Vbias terminal, a half-bridge output terminal (Vbridge) and a half-bridge ground terminal;

an Application-Specific Integrated Circuit (ASIC) within the case and attached to the chip paddle, the ASIC including:
a VOUT bond pad;
a VCC bond pad;
a GND bond pad; and
bond pads for connecting to the push-pull half bridge circuit including a half bridge Vbias bond pad, a half bridge GND bond pad, and a half-bridge output (Vbridge) bond pad; and a plurality of wire bonds, including:
a wire bond electrically connecting the VOUT bond pad of the ASIC to the output terminal;
a wire bond electrically connecting the VCC bond pad to the VCC terminal;
a wire bond electrically connecting the GND bond pad to the ground terminal;
a wire bond electrically connecting the half-bridge Vbias bond pad to the half-bridge Vbias terminal;
a wire bond electrically connecting the half-bridge GND bond pad to the half-bridge ground terminal; and
a wire bond electrically connecting the half-bridge output (Vbridge) to the half-bridge output terminal (Vbridge).

2. The push-pull half-bridge magnetoresistive switch sensor according to claim 1, wherein the ASIC is configured to convert a signal at the half-bridge output terminal into a switching signal.

3. The push-pull half-bridge magnetoresistive switch sensor according to claim 1, wherein the magnetoresistive elements include magnetic tunnel junction (MTJ) elements.

4. The push-pull half-bridge magnetoresistive switch sensor according to claim 1, wherein the magnetoresistive elements include a giant magnetoresistive (GMR) elements.

5. The push-pull half-bridge magnetoresistive switch sensor according to claim 1, wherein the magnetoresistive elements include an anisotropic magnetoresistive (AMR) elements.

6. The push-pull half-bridge magnetoresistive switch sensor according to claim 1, wherein the magnetoresistive elements use on-chip permanent magnet bias.

7. The push-pull half-bridge magnetoresistive switch sensor according to claim 1, wherein the magnetoresistive elements use in-stack magnet bias.

8. The push-pull half-bridge magnetoresistive switch sensor according to claim 1, wherein the magnetoresistive elements use shape anisotropy for magnet bias.

9. The push-pull half-bridge magnetoresistive switch sensor according to claim 1, wherein the two magnetic sensor chips are arranged such that their sensing axes are the same, and the sensing axis direction is parallel to the line through the center of both magnetic sensor chips.

10. The push-pull half-bridge magnetoresistive switch sensor according to claim 1, wherein the two magnetic sensor chips are arranged such that their sensing axes are the same, and the sensing axis direction is perpendicular to the line through the center of both magnetic sensor chips.

11. A push-pull half-bridge magnetoresistive switch sensor, comprising:
a case;
a leadframe-based chip paddle with a protrusion to form a ground terminal extending from inside to outside of the case, a first pin to form a VCC terminal extending from inside to outside of the case, and a second pin to form an output terminal extending from inside to outside of the case;

two magnetic sensor chips within the case, including a first magnetoresistive sensor chip with at least one magnetoresistive element and a first pinned layer magnetization vector and a second magnetoresistive sensor chip with at least one magnetoresistive element and a second pinned layer magnetization vector, the first and second magnetoresistive sensor chips being attached to the chip paddle and arranged for the first and second pinned layer magnetization vectors to be at a 180 degree rotational angle relative to each other, wherein each of the magnetic sensor chips has corners and bond pads located in the corners for electrical connection, and the magnetic sensor chips are electrically connected via wire bonds to provide series-connected magnetoresistive elements to form a push-pull half-bridge circuit, the push-pull half-bridge circuitry including a half-bridge Vbias terminal, a half-bridge output terminal (Vbridge) and a half-bridge ground terminal;

an Application-Specific Integrated Circuit (ASIC) within the case and attached to the chip paddle, the ASIC including:
a VOUT bond pad;
a VCC bond pad; and
a GND bond pad; and
bond pads for connecting to the push-pull half bridge circuit including a half bridge Vbias bond pad, a half bridge GND bond pad, and a half-bridge output (Vbridge) bond pad; and a plurality of wire bonds, including:
a wire bond electrically connecting the VOUT bond pad of the ASIC to the output terminal;
a wire bond electrically connecting the VCC bond pad to the VCC terminal;
a wire bond electrically connecting the GND bond pad to the ground terminal;
a wire bond electrically connecting the half-bridge Vbias bond pad to the half-bridge Vbias terminal;
a wire bond electrically connecting the half-bridge GND bond pad to the half-bridge ground terminal; and
a wire bond electrically connecting the half-bridge output (Vbridge) to the half-bridge output terminal (Vbridge).

12. The push-pull half-bridge magnetoresistive switch sensor according to claim 5, wherein the ASIC is configured to convert a signal at the half-bridge output terminal into a switching signal.

13. The push-pull half-bridge magnetoresistive switch sensor according to claim 11, wherein the magnetoresistive elements include magnetic tunnel junction (MTJ) elements.

14. The push-pull half-bridge magnetoresistive switch sensor according to claim 11, wherein the magnetoresistive elements include giant magnetoresistive (GMR) elements.

15. The push-pull half-bridge magnetoresistive switch sensor according to claim 11, wherein the magnetoresistive elements include an anisotropic magnetoresistive (AMR) elements.

16. The push-pull half-bridge magnetoresistive switch sensor according to claim 11, wherein the magnetoresistive elements use on-chip permanent magnet bias.

17. The push-pull half-bridge magnetoresistive switch sensor according to claim 11, wherein the magnetoresistive elements use in-stack magnet bias.

18. The push-pull half-bridge magnetoresistive switch sensor according to claim 11, wherein the magnetoresistive elements use shape anisotropy for magnet bias.

19. The push-pull half-bridge magnetoresistive switch sensor according to claim 11, wherein the two magnetic sensor chips are arranged such that their sensing axes are the same, and the sensing axis direction is parallel to the line through the center of both magnetic sensor chips.

20. The push-pull half-bridge magnetoresistive switch sensor according to claim 11, wherein the two magnetic sensor chips are arranged such that their sensing axes are the same, and the sensing axis direction is perpendicular to the line through the center of both magnetic sensor chips.

* * * * *